United States Patent [19]

Sekiguchi

[11] Patent Number: 5,818,727
[45] Date of Patent: Oct. 6, 1998

[54] DESIGN SYSTEM AND METHOD FOR SEMICONDUCTOR INTEGRATED CIRCUITS

[75] Inventor: Hideyuki Sekiguchi, Kawasaki, Japan

[73] Assignee: Fujitsu Limited, Kawasaki, Japan

[21] Appl. No.: 625,240

[22] Filed: Apr. 1, 1996

Related U.S. Application Data

[63] Continuation of Ser. No. 297,769, Aug. 30, 1994, abandoned.

[30] Foreign Application Priority Data

Sep. 9, 1993 [JP] Japan .................................. 5-224467

[51] Int. Cl.$^6$ .............................. G06F 17/00; G06F 17/50
[52] U.S. Cl. ......................... 364/490; 364/488; 364/489; 364/491
[58] Field of Search ..................... 364/488, 489, 364/490, 491, 578; 395/500; 257/368, 395, 385

[56] References Cited

U.S. PATENT DOCUMENTS

| | | | |
|---|---|---|---|
| 4,379,343 | 4/1983 | Moyer ...................................... | 365/185 |
| 5,111,413 | 5/1992 | Lazansky et al. ....................... | 364/578 |
| 5,164,911 | 11/1992 | Juran et al. .............................. | 364/488 |
| 5,348,902 | 9/1994 | Shimada et al. .......................... | 437/51 |
| 5,359,537 | 10/1994 | Saucier et al. .......................... | 364/489 |
| 5,532,934 | 7/1996 | Rostoker ................................. | 364/488 |

OTHER PUBLICATIONS

Hiwatashi et al. "An Interactive/Automatic Floor Planner for Hierarchically Designed Cell Based VLSIs," IEEE, 1990, pp. 30.4.1–30.4.4.

Marvin E. Daniel and Charles W. Gwyn, "CAD System for IC Design", IEEE, pp. 1–12, 1982.

*Primary Examiner*—Emanuel Todd Voeltz
*Assistant Examiner*—Vuthe Siek
*Attorney, Agent, or Firm*—Staas & Halsey

[57] ABSTRACT

A system for designing an IC (semiconductor integrated circuit) including an extracting unit for extracting element data for forming unit cells from design data of an IC to be designed, a framing unit for framing pattern data indicative of the size of each unit cell on the basis of the element data from the extracting unit and design standard data with which the layout rules are prescribed, a calculating unit for calculating the whole area of the IC on the basis of the pattern data from the framing means, and an arranging unit for arranging the unit cells within a layout range predicted by the area data from a predicting unit on the basis of the pattern data. A method for designing an IC includes the steps of extracting element data for forming the unit cells from a net list wherein there are described the circuit elements forming an IC under design, parameters specific to each circuit element, and connections among the circuit elements, framing unit cells on the basis of the extracted element data and design standard data with which the layout rules are prescribed, predicting a layout region by calculating the whole area of the IC on the basis of pattern data of the framed unit cells and arranging the framed unit cells within the predicted layout range.

23 Claims, 13 Drawing Sheets

FIG.7

```
circuit ( vss:p out:b in:b vii:p )
{
r  r02  out  vss  5 ;
tn120  t06  n04  n04  n03  vss  10 10 ;
tn120  t05  vss  vss  n03  vss  10 10 ;
r  r01  n02  n03  5 ;
tn  t08  out  vss  n04  vss  0.36 50 ;
tp  t07  out  vii  n04  vii  0.46 100 ;
tn  t02  n01  vss  in  vss  0.36 5 ;
tp  t01  n01  vii  in  vii  0.46 10 ;
tn  t04  n02  vss  n01  vss  0.36 5 ;
tp  t03  n02  vii  n01  vii  0.46 10 ;
}
```
~DIN

FIG.8
DR

```
Resist  ; rpsd rnsd rpad rpan      %RESISTOR
PchDis  ; tp tp110 tp120           %p ch TRANSISTOR
NchDis  ; tn tn110                 %n ch TRANSISTOR
PchMax  ; 60                       %p ch TRANSISTOR
NchMax  ; 40                       %n ch TRANSISTOR
PSDPSD  ; 1.0                      %p ch  DIFFUSION LAYER
NSDNSD  ; 1.0                      %n ch  DIFFUSION LAYER
NAMinh  ; 1.0                      % CONTACT WINDOW
NAMinv  ; 1.0                      % CONTACT WINDOW
             .
             .
             .
```

DESIGN SYSTEM AND METHOD FOR SEMICONDUCTOR INTEGRATED CIRCUITS

This application is a continuation of application Ser. No. 08/297,769, filed Aug. 30, 1994, now abandoned.

BACKGROUND OF THE INVENTION

1. Field of the Invention

The present invention relates to a design system and method for semiconductor integrated circuits.

2. Description of the Related Art

Recently, with the requirement for enhancement in performance and function of semiconductor integrated circuits (hereinafter, referred to as "ICs"), a CAD (computer aided design) system for arranging unit circuits (hereinafter, referred to as "unit cell") on the basis of layout data has been used in designing a new IC.

Generally, IC design requires operations for arranging the unit cells and/or wiring (hereinafter, referred to as "floor-planning") in the course of design. These operations are important ones that decide the size of the whole chip and its performance.

In consideration of the requirement for cost reduction and speedup of IC's by means of microminiaturization, in designing a new IC, design of a cell library base (hereinafter, referred to as "cell library method") is adopted.

However, such a method is not necessarily said to be optimal to the design of memories, etc., because the unit cells necessary for the cell arrangement cannot be finally decided until the whole circuit on the chip is decided. And, preparation for layout data of an IC to be designed, such as extraction of parasitic capacitances and wiring resistance, must be made manually.

It would be useful for a better understanding to explain the related art of the invention. For example, a CAD system wherein the unit cells are arranged based on layout data DOUT comprises a keyboard 1, memory 2, display 3 and controller 4 as shown in FIG. 1.

It is a function of the CAD system to supply layout data from the memory 2 in response to external input data D5 through the keyboard 1 by user. The layout data DOUT are ones which have been framed manually by a user and which are each indicative of respective unit cells of the IC to be designed. And, a layout pattern under design is displayed on the display 3 screen.

In FIG. 2, we now explain the preparation for layout data. In order to prepare for layout data of an IC to be newly designed, for example, a unit cell for the new IC is first determined provisionally at step P1. Here, the unit cell is determined on the basis of a net list where there are described element parameters on transistors, resistors, capacitors, etc., and the connections among them. Also, assuming a rough overall wiring, data on parasitic capacitances and wiring resistances are framed in advance. Then, an arrangement pattern of unit cells is made at step P2. In this case, a unit cell means a set of element patterns necessary for cell arrangement. The framed unit cells are arranged utilizing pattern arranging functions of the CAD system.

Next, at step P3, the unit cells are rearranged to carry out a simulation of the whole circuit. The rearrangement is done using the CAD system, for example, by the user entering modifying information through the keyboard 1 for modifying the cell arrangement. The parasitic capacitances and wiring resistances for the whole circuit are extracted again through the rearrangement of the unit cells. Thus, the rearranged unit cells constitute the whole circuit of the IC, just like a single cell. The designer simulates the whole circuit.

Then, at step P4, a delay adjustment of the whole circuit including the unit cells is made. If the layout for the IC is executed (in case of YES) at step P5, the unit cell and the whole circuit are determined at a time. Otherwise (in case of NO), returning to step P1, the data processing is tried again from the beginning.

Thus, layout data necessary for cell arrangement are prepared and the whole chip is designed.

SUMMARY OF THE INVENTION

It is an object of the invention to reduce manual operation to a minimum and enhance the precision of simulation in designing a memory of any kind by precisely predicting the area of the whole circuit on the basis of the net list without depending on the cell library method.

The above object is achieved by a system of designing a semiconductor integrated circuit according to the invention. The system for designing an integrated circuit comprises classifying and extracting means for classifying and extracting each element data for transistors, capacitors and resistors constituting each unit cell by the kind of element; element arranging means for converting each extracted and classified element data into an element pattern and for arranging the converted element patterns with ones falling within each kind of element gathered together; and calculating means for calculating each area of the arranged element patterns and for summing each calculated area for each kind to yield the overall area of the unit cells.

Namely, the system of designing a semiconductor integrated circuit comprises extracting means for extracting element data for constituting the unit cells from design data of an IC to be designed; framing means for framing pattern data indicative of the size of each unit cell on the basis of the element data from the extracting means and design standard data with which the layout rules are prescribed; calculating means for calculating the whole area of an IC under design on the basis of the pattern data from the framing means; and arranging means for arranging the unit cells within a layout range predicted by means of the area data from the predicting means on the basis of the pattern data.

Thus, the unit cells can be arranged in a rough range of the IC which is predicted on the basis of the pattern data. Also, the unit cells of the IC can be arranged selecting either layout data framed on the basis of the pattern data or layout data framed on the basis of the area data and circuit data. Therefore, a circuit simulation can be executed under the circuit condition most similar to that of a completed actual chip.

According to the present invention, a method for designing semiconductor integrated circuits comprises the steps of classifying and extracting each element data for transistors, capacitors and resistors constituting each unit cell by the kind of element; converting each extracted and classified element data into an element pattern and arranging the converted element patterns with ones falling within each kind of element gathered together; and calculating each area of the arranged element patterns and for summing each calculated area for each kind to yield the overall area of the unit cells.

Namely, a method for designing a semiconductor integrated circuit (IC) according to the invention comprises the steps of extracting element data for constituting the unit cells from a net list wherein there are described the circuit elements constituting the IC, parameters specific to each circuit element, and connections among the circuit elements; framing unit cells on the basis of the extracted element data and design standard data with which the layout rules are prescribed; predicting a layout region by calculating the whole area of the IC on the basis of pattern data of the framed unit cells; and arranging the framed unit cells within the predicted layout range.

Thus, as compared with the related art of the invention, the method for designing an IC makes it possible to determine automatically the unit cells necessary for cell arrangement in an early stage of design and to reduce manual operations. Also, the area of the whole circuit is precisely and promptly estimated without depending on the cell library method in designing a memory of any kind.

Therefore, a floor planning is automated and accordingly a time period for layout operations is reduced. Moreover, since a simulation of the whole circuit on chip can be executed with a pattern approximate to that of a finished chip, operation of the IC can be precisely examined.

Further, according to the method for designing an IC of the invention, a prompt response is possible for modifications in layout design standards and layout techniques because the control program can be rewritten at any time. Therefore, it greatly contributes to an early development of a new IC and to a functional enhancement in a system of designing an IC.

BRIEF DESCRIPTION OF THE DRAWINGS

FIG. 7 is a diagram illustrating the contents of design data of the system for designing an IC as shown in FIG. 5;

FIG. 8 is a diagram illustrating the contents of rule data of the system for designing an IC as shown in FIG. 5;

DETAILED DESCRIPTION

Now, we recall that according to a method of the related art of the invention, a cell library method is adopted in consideration of the requirement for cost reduction and speed-up of IC's by means of microminiaturization.

Thus, such a method is not necessarily said to be optimal to the design of memories, etc., and impracticable because it is extremely near the time when the whole circuit on the chip is decided and the unit cells necessary for the cell arrangement are finally decided. As is usually the case with memories, a memory array comprises many repetitive patterns and is surrounded by peripheral circuits, making it possible to predict the whole chip in an early stage to a certain extent.

Also, according to the related art of the invention, the extraction of parasitic capacitances and wiring resistances, which are necessary for the calculation of delay and the framing of layout data, is done by manual operations.

This, requires creation of layout data from element data used for circuit simulation, which may easily cause a difference between the layout area of the predicted IC and that on the CAD system.

The simulation result based on a cell arrangement on the CAD system may differ from that of the time when a certain progress has been made in design process. There may be even a case when a design must be done again from the beginning because a prepared package cannot accommodate the new IC chip.

This causes such a problem that an early development of a new IC is prevented because the dependence on the above cell library method results in a further increase in manual operations with the requirement for enhancement in performance and function of a semiconductor integrated circuit.

These and other problems of the related art are overcome and an advance is made over the art according to the present invention. The system for designing an integrated circuit according to the principle of the invention, comprises classifying and extracting means for classifying and extracting each element data for transistors, capacitors and resistors constituting each unit cell by the kind of element; element arranging means for converting each extracted and classified element data into an element pattern and for arranging the converted element patterns with ones falling within each kind of element gathered together; and calculating means for calculating each area of the arranged element patterns and for summing each calculated area for each kind to yield the overall area of the unit cells.

Figure 1:
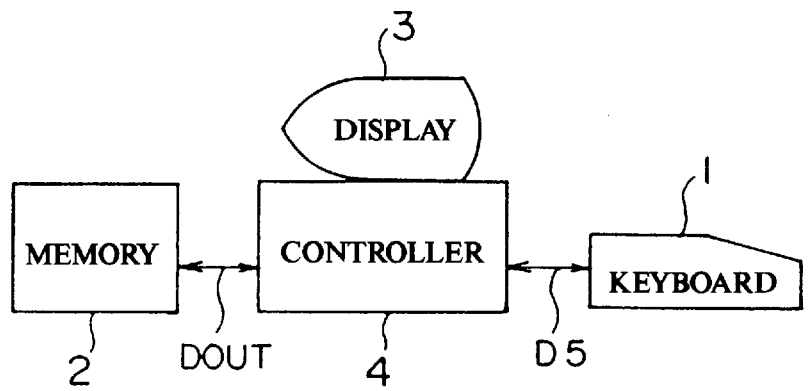
FIG. 1 is a diagram showing a structure of a CAD system according to the related art of the invention.
Figure 2:
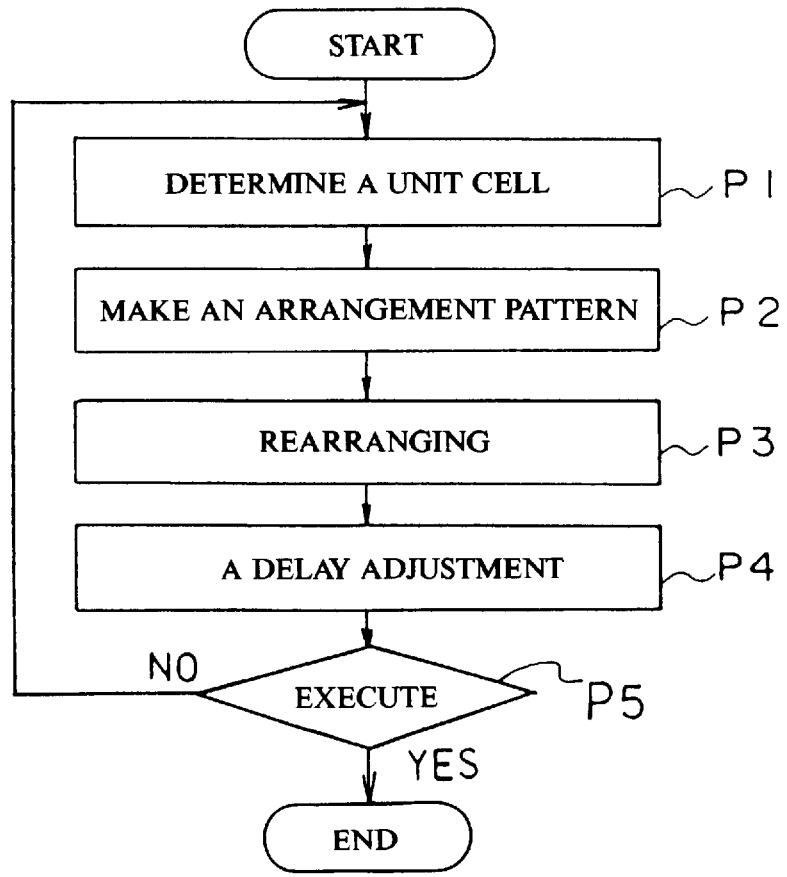
FIG. 2 is a diagram explaining an IC design method to which the CAD system shown in FIG. 1 is applied.
Figure 3:
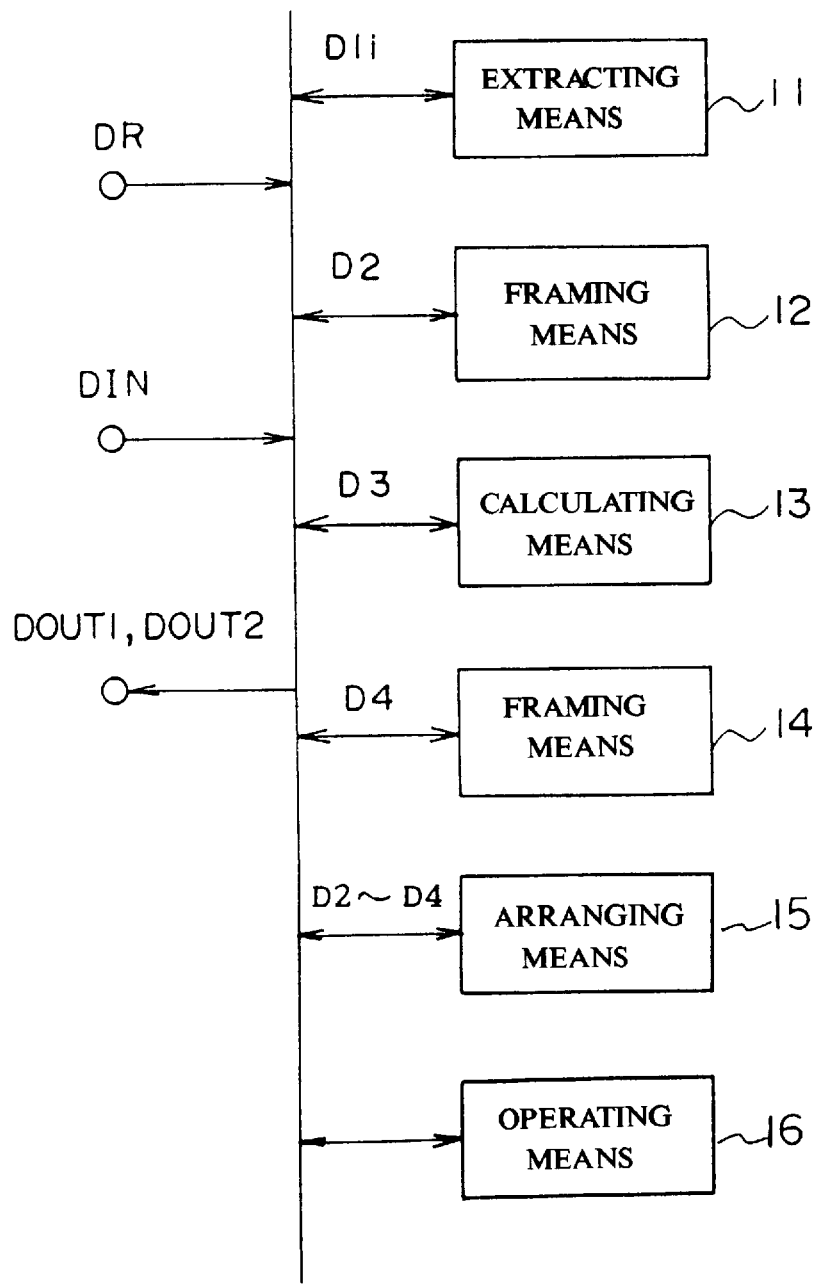
FIG. 3 is a diagram showing an arrangement of a system of designing an IC according to the principle of the invention.

Namely, a system for designing a semiconductor integrated circuit, as shown in FIG. 3, comprises extracting means 11 for extracting element data D1i (i–1, 2, 3 . . . ) for constituting unit cells from design data DIN of a new IC under design; framing means 12 for framing pattern data D2 indicative of the size of each unit cell on the basis of the element data D1i from the extracting means 11 and design standard data DR with which the layout rules are prescribed; calculating means 13 for calculating the whole area of an IC under design on the basis of pattern data D2 from the framing means 12; and arranging means 15 for arranging the unit cells within a layout range predicted by means of the area data D3 from the calculating means 13 on the basis of the pattern data D2 from the framing means 12.

Also, the system of designing an IC shown in FIG. 3 is provided with framing means 14 for framing symbol data (hereinafter, also referred to as "circuit data") D4 of the IC under design on the basis of pattern data D2, from the framing means 12, as which each unit cell has been expressed in the form of a pattern and operating means 16 for simulating the circuit by wiring among the arranged unit cells.

A method for designing semiconductor integrated circuits according to the principle of the invention, comprises the steps of classifying and extracting each element data for transistors, capacitors and resistors constituting each unit cell by the kind of element; converting each extracted and classified element data into an element pattern and arranging the converted element patterns with ones falling within each kind of element gathered together; and calculating each area of the arranged element patterns and for summing each calculated area for each kind to yield the overall area of said unit cells.

Figure 4:
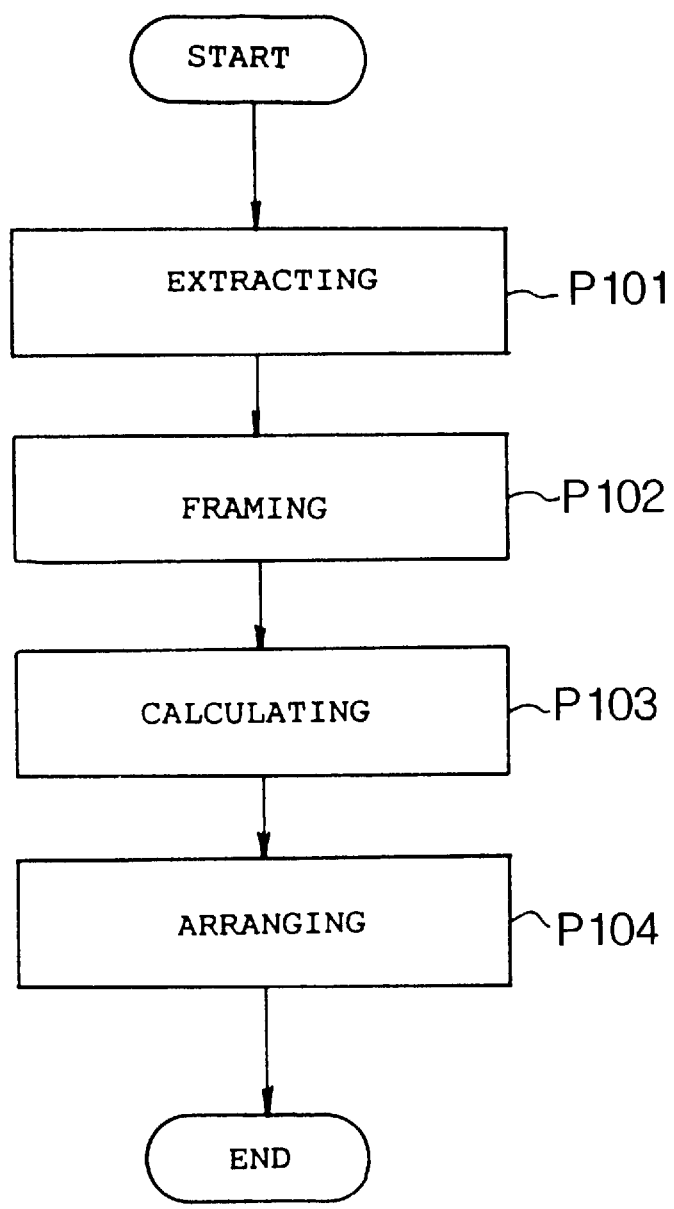
FIG. 4 is a flow chart illustrating a method for designing IC according to the principle of the invention.

Namely, a method for designing an IC, as shown in a flow chart of FIG. 4, comprises the steps of: extracting element data D1i for constituting the unit cells from design data DIN of an IC to be designed at step P101; framing pattern data D2 for each kind of unit cell on the basis of the extracted element data D1i and design standard data DR with which the layout rules are prescribed at step P102; calculating the whole area of the IC on the basis of the framed pattern data D2 of unit cells for predicting a layout range at step P103; and arranging the framed unit cells within the predicted layout range at step P104.

The method for designing an IC according to the principle of the invention includes the step of simulating the circuit by wiring among the unit cells after the unit cells are arranged.

In the method for designing an IC according to the principle of the invention, the design data DIN includes a net list in which there are described the circuit elements constituting the IC, parameters specific to each circuit element, and connections among the circuit elements.

In the method for designing an IC according to the principle of the invention, as an element data D1i, there are individually found in a net list minimum device units of active and passive elements which each constitute a unit cell.

In the method for designing an IC according to the principle of the invention, as an element data D1i, there are individually found in a net list p-type and n-type field effect transistors (FETs), capacitors formed of p-type and n-type FETs, resistors and the other independent special circuits.

In the method for designing an IC according to the principle of the invention, pattern data D2 for each kind of unit cell are framed discriminating between first element patterns such as p-type and n-type FETs, capacitors formed of the former FETs and resistors each extracted from a net list are individually expressed in the form of a pattern and second element patterns as which independent special circuits other than the above elements extracted from the net list are expressed in the form of a pattern.

In the method for designing an IC according to the principle of the invention, pattern data D2 for each kind of unit cell are framed discriminating between a first collective element pattern of elements which share a diffusion layer and a second collective element pattern of elements, the gates of which are separated from one another by processing element patterns of p-type and n-type transistors which have been extracted from the net list.

In the method for designing an IC according to the principle of the invention, the step of predicting a layout range for the IC includes the steps of: calculating the area of each kind of unit cell which is a minimum layout unit from first element patterns such as p-type and n-type FETs, extracting capacitors formed of the former FETs and resistors from a net list and individually expressing the same in the form of a pattern and second element patterns as which independent special circuits other than the above elements extracted from the net list are expressed in the form of a pattern; and finding the sum of the areas of the unit cells.

In the method for designing an IC according to the principle of the invention, the step of predicting a layout range for the IC includes the steps of: separating a collective element pattern of p-type FETs and a collective element pattern of n-type FETs extracted from the net list; and calculating the area of the whole circuit of the IC from the two collective element patterns.

The method for designing an IC according to the principle of the invention includes the step of rewriting the control program for controlling the extraction of element data, the framing of unit cells, the prediction of a layout range and the arrangement of the cells.

Now, we explain the operations of the system for designing an IC according to the principle of the invention. For example, each element data for transistors, capacitors and resistors which constitute each unit cell is classified by the kind of element and extracted by classifying and extracting means. Each of the classified and extracted element data for transistors, capacitors and resistors is converted by arranging means into an element pattern. The converted element patterns are arranged with ones which correspond to each kind of element gathered in an identical area.

Further, each area of element pattern arranged in an identical region is calculated by calculation means and the calculated areas for each region are summed.

Namely, when design data DIN are supplied to the system, the extracting means 11 separates the design data DIN into each element data D1i for minimum units, or active and passive elements. Then, the framing means 12 frames pattern data D2 indicating element patterns for an active or a passive element based on the separated element data D1i and the design standard data DR.

Then, the calculating means 13 calculates the area data D3 for the IC on the basis of pattern data D2. On the basis of the area data D3, the area of unit cells of each kind and the whole area of the IC are predicted. And, within the layout range predicted from the area data D3, the arranging means 15 arranges the unit cells on the basis of the pattern data D2 from the framing means 12.

Also, even when the whole area of the IC is not predicted, if the other framing means 14, for example, frames symbol data of the IC, D4 (or circuit data), based on pattern data D2 as which the unit cells are expressed in the form of a pattern, then the arranging means 15 can arrange the unit cells based on the symbol data from the framing means 14.

In this way, the cells are arranged within the layout range of the IC which is predicted based on the area data D3. Thus, the arranged unit cells are wired to form a circuit, and the operation means 15 becomes capable of simulating the circuit under the circuit condition most similar to that of a completed actual chip.

According to a method for designing an IC of the invention in FIG. 4, when element data for constituting a unit cell are extracted from the design data of an IC to be newly designed at step P101, the unit cell is framed on the basis of the element data D1i and the design standard data DR at step P102, where the design data DIN are used for a net list wherein there are described the circuit elements constituting the IC, parameters specific to each circuit element and connective relations among circuit elements.

Thus, p-type and n-type FETs, capacitors formed of the former FETs and resistors, and the other independent special circuits are found as element data D1i constituting a unit cell in the net list. And, first element patterns are framed by individually expressing p-type and n-type FETs, capacitors formed of the former FETs and resistors in the form of a pattern on the basis of the element data D1i. For example, by processing the element patterns for p-type and n-type FETs, a unit cell is framed separately as a first collective element pattern which shares a diffusion layer and a second collective element pattern in which the gates are separated from one another.

Also, second element patterns are framed by expressing independent special circuits other than the above elements in the form of a pattern.

Thus, each (pattern data) of the unit cells can be automatically determined in an earlier stage as compared with the related art of the invention in consideration of the reduction of size on the basis of the element data D1i extracted in response to the necessary elements for the unit cell.

At step P103 the whole area of the IC is calculated from the pattern data D2 of the unit cells. The whole area of the IC is calculated, for example, by calculating each area of the unit cells or minimum layout units from the first and the second element patterns and summing up the areas. Alternatively, the whole area of the IC may be calculated by separating the collective element patterns for p-type FETs and the ones for n-type FETs and calculating the whole area from the two kind of collective element patterns.

Thus, the size of the whole chip can be predicted in an early stage, which includes a memory array comprising unit cells and many repetitive patterns and surrounded by peripheral circuits.

In designing an IC such as a memory device, etc., the whole area of the IC can be precisely and promptly estimated on the basis of a net list without depending on the cell library method.

At step P104, the unit cells are arranged within a layout range predicted from the whole area of the IC.

The optimization of unit cell arrangement and wiring among unit cells enables a simulation of the whole circuit on a chip with almost the same pattern as that of a finished product and accordingly a precise examination of the operation of the IC.

Thus, a floor planing which has been performed manually as in the related art automatically causes the time period for layout to be reduced, which can sufficiently cope with the design of an IC such as a memory, etc.

Further, according to a method for designing an IC of the invention, the control program is rewritable.

Therefore, the method can cope promptly with alterations of the layout design standards of an IC device and the layout techniques. It greatly contributes to the early development of a new IC device and the functional enhancement of an IC design system.

Now, referring to the drawings, we explain preferred embodiments of the invention.

Figure 5:
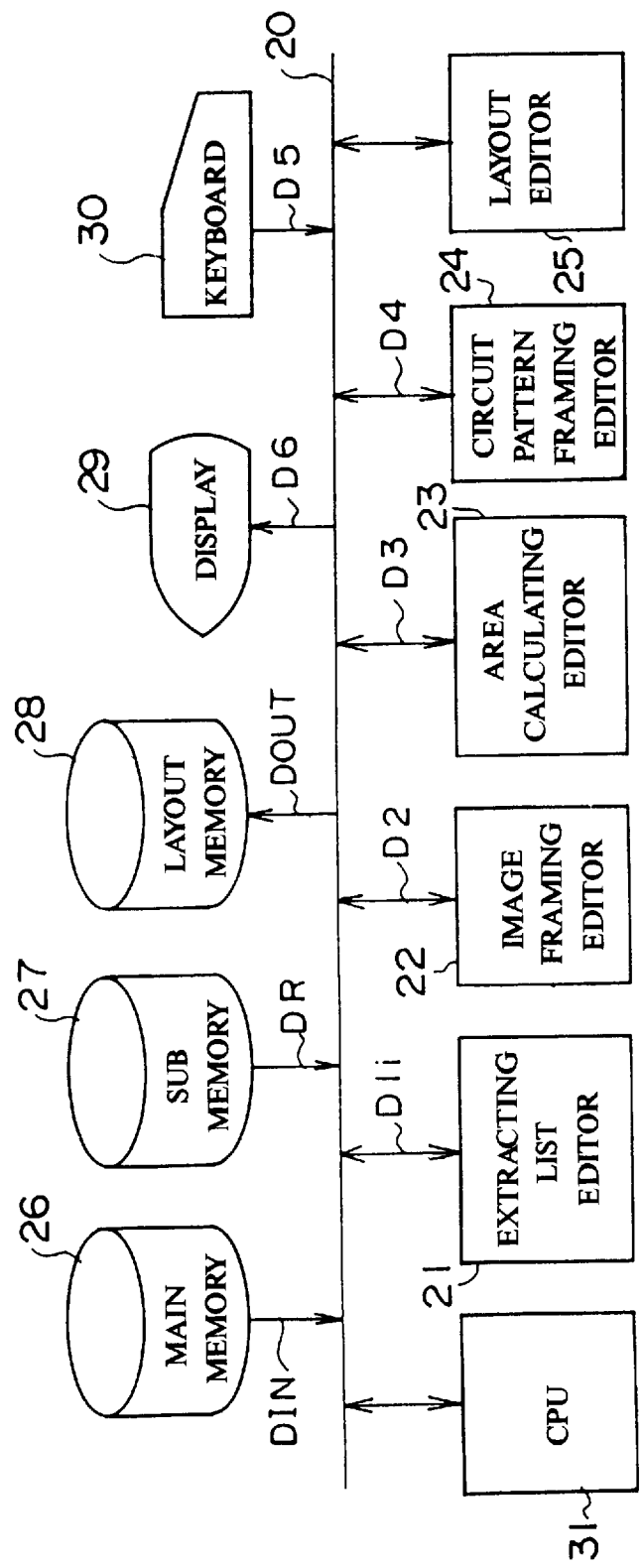
FIG. 5 is a diagram showing an arrangement of a system for designing an IC according to a preferred embodiment of the invention.

For example, a system for designing an IC with automated floor-planning capability, as shown in FIG. 5, comprises an extracting list editor 21, an image framing editor 22, an area calculating editor 23, a circuit pattern framing editor 24, a layout editor 25, a main memory 26, a sub-memory 27, a layout memory 28, a display 29, a keyboard 30 and a CPU (central processing unit) 31.

Figure 10:
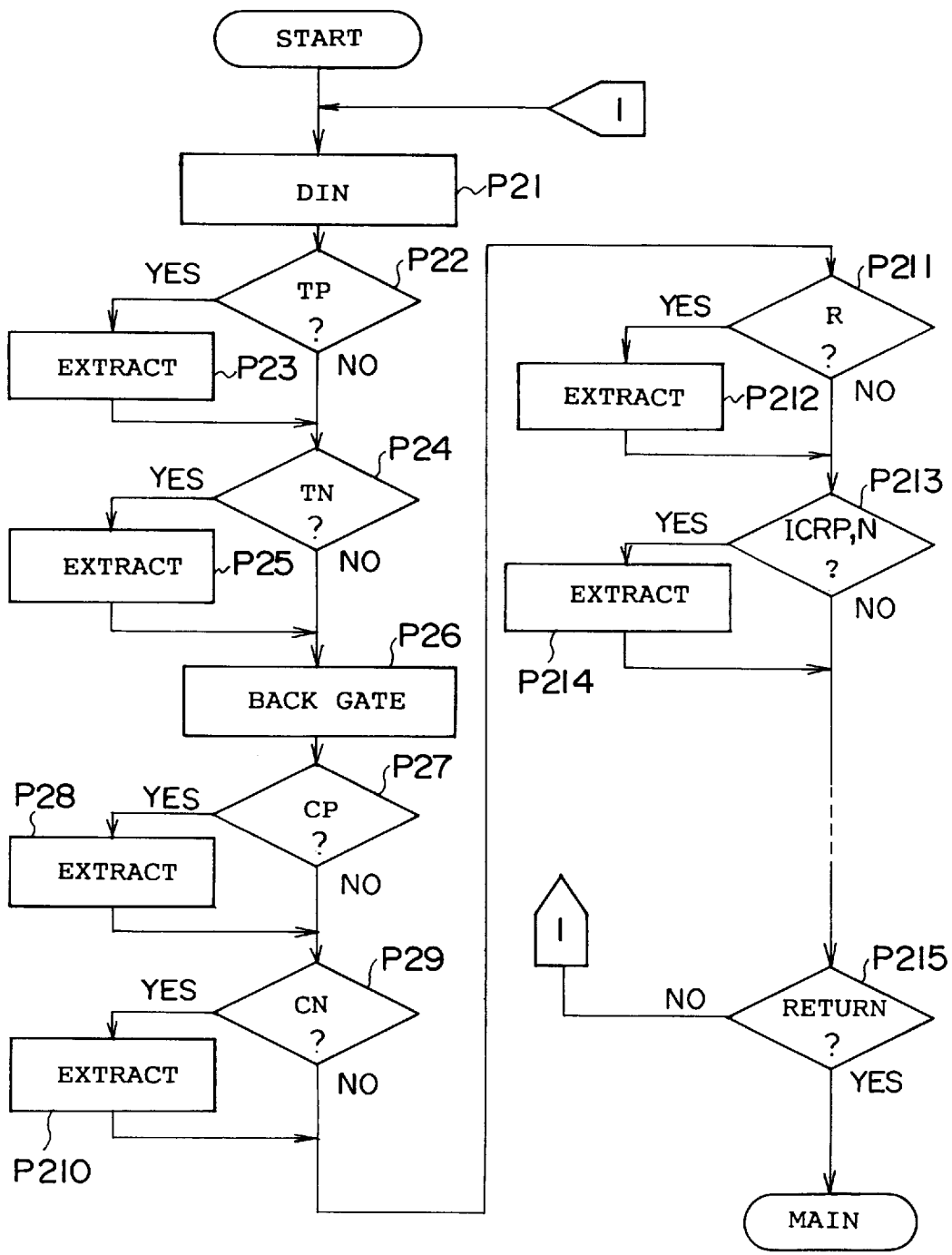
FIG. 10 is a flow chart (of a subroutine) of list classification concerning the flow chart shown in FIG. 9.

Specifically, the extracting list editor 21, which is an example of the extracting means 11, separates element data D1i for a minimum unit or an element from the design data DIN of an IC to be newly designed, where i=1, 2, . . . , 5. The internal structure of the extracting list editor 21 will be described in connection with FIG. 7. The contents of the design data DIN is described with the contents of the elements in relation to FIG. 7. The control flow chart of the list editor 21 is shown in FIG. 10.

Figure 12:
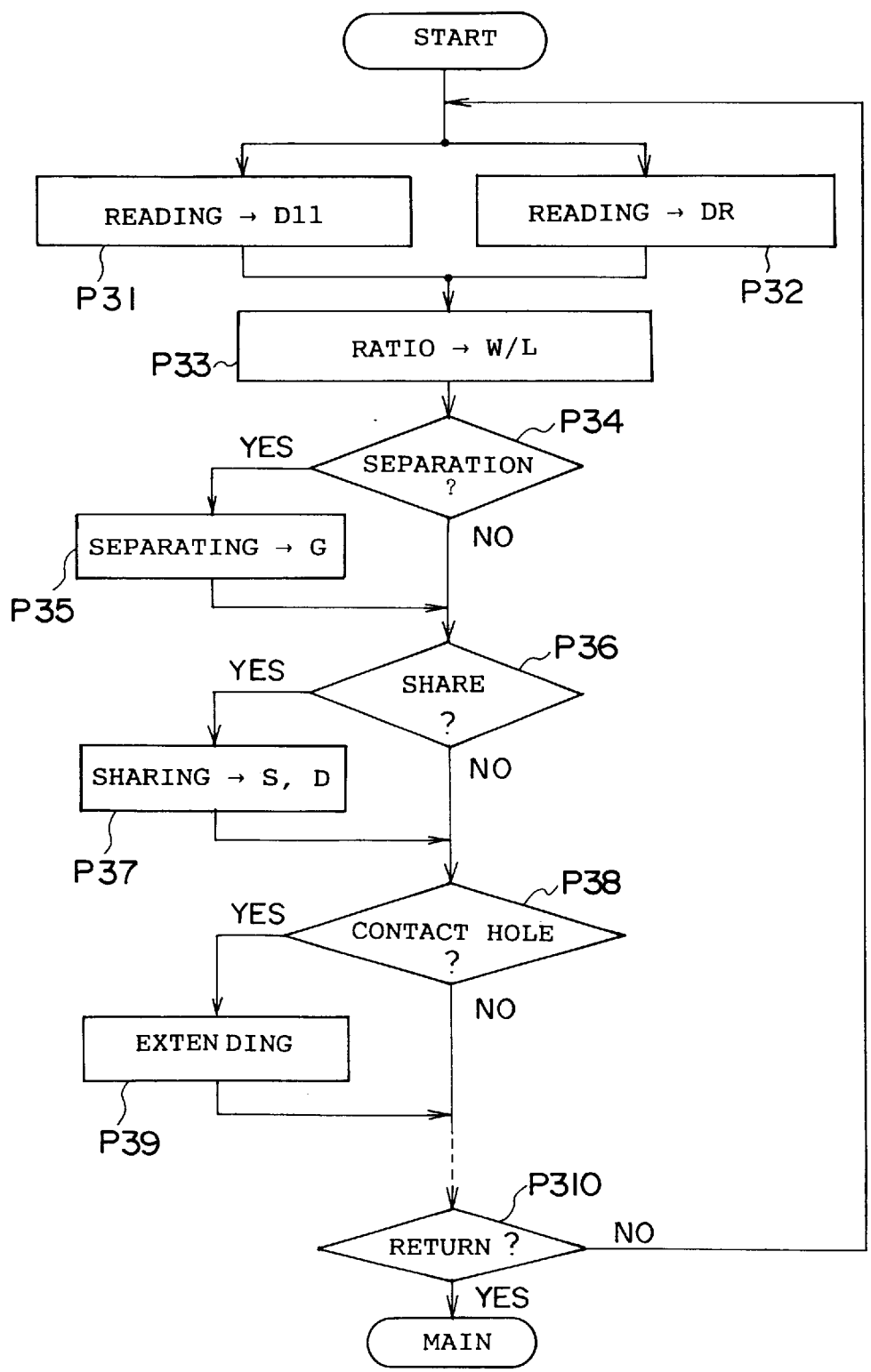
FIG. 12 is a flow chart (of a subroutine) of image creation concerning the flow chart of IC design shown in FIG. 9.

The image framing editor 22, which is an example of the framing means 12, frames pattern data (hereinafter, referred to as "image data") D2 representative of an element pattern for an active or passive element on the basis of the design standard data (hereinafter, referred to as "rule data") DR with which the layout design standards of the IC are prescribed and an element data D1i of an element or a minimum device unit. The control flow chart for the image framing editor 22 is shown in FIG. 12.

Figure 14:
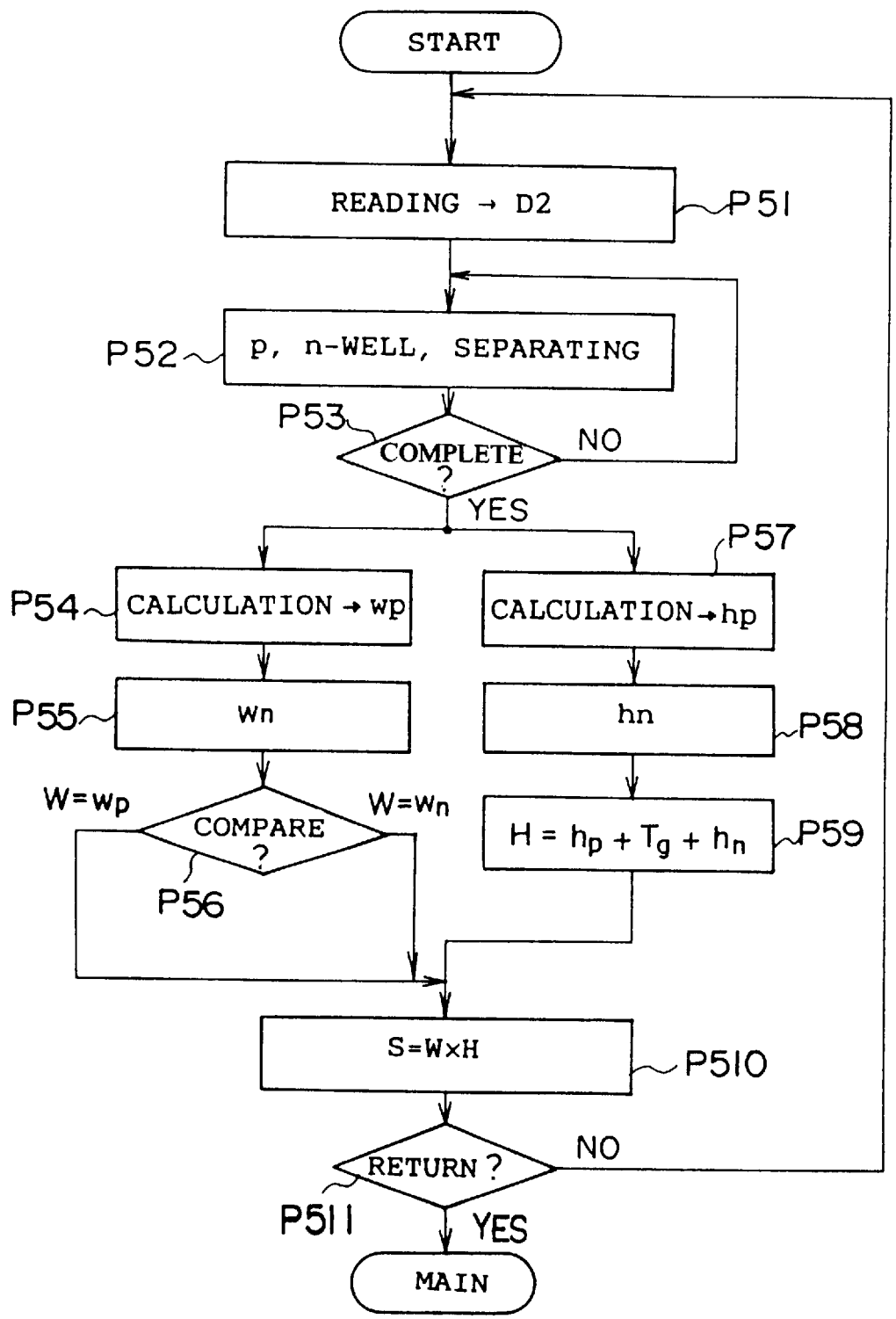
FIG. 14 is a flow chart (of a subroutine) of area calculation concerning the flow chart of IC design shown in FIG. 9.

The area calculating editor 23, which is an example of the calculating means 13, calculates the area data D3 of the IC on the basis of image data D2. The control flow chart for the area calculating editor 23 is shown in FIG. 14.

The circuit pattern framing editor 24, which is an example of the other framing means 14, supplies circuit data (symbol data) D4 representative of a circuit symbol of an element pattern based on the area data D3.

The layout editor 25 is an example of the arranging means 15 and arranges the unit cells based on either image data D2 or circuit data D4 to yield layout data DOUT of the IC under design.

The main memory 26 stores design data DIN and comprises one or more magnetic disks. The sub-memory 27 stores rule data DR, a main routine controlling the system, etc. The layout memory 28 stores layout data DOUT for the IC.

The display 29 displays a net list, a circuit pattern in a design process, a layout representation for unit cells and so forth on the basis of display data D6. The keyboard 30 is a tool for supporting the input of external data D5.

The CPU 31 operates for controlling input and output of the extracting list editor 21, image framing editor 22, area calculating editor 23, circuit pattern framing editor 24, layout editor 25, main memory 26, sub-memory 27, layout memory 28, display 29 and keyboard 30, which are connected to the system bus 20 for sending and receiving data DIN, DR, D1i, D2 through D6, DOUT1 and DOUT2.

The CPU 31 is provided with the functions of the calculating means 15 and executes a circuit simulation under circuit conditions almost the same as those of a finished chip after the layout editor 25 has completed wiring.

Figure 6:
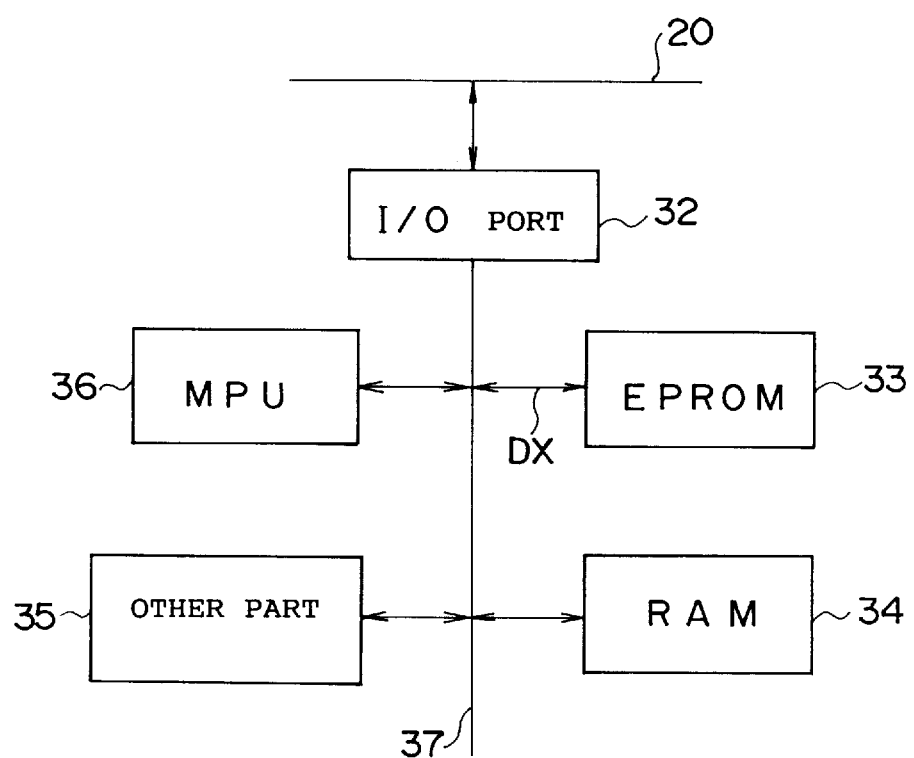
FIG. 6 is a diagram showing an internal arrangement of each editor of the system for designing IC as shown in FIG. 5.

Each of the editors 21 through 25, as shown in FIG. 6, includes an input/output port 32, EPROM (electrically erasable read only memory) 33, RAM (random access memory) 34, an MPU (microprocessor) 36, and the other part 35.

For example, the extracting list editor 21 has the EPROM 33 containing a control program as shown in FIG. 10, the image framing editor 22 has the EPROM containing a control program as shown in FIG. 12, and the area calculating editor 23 has the EPROM containing a control program as shown in FIG. 14.

These EPROMs 33 supply control data DX based on respective control programs. According to the control data DX, the MPU 36 transfers data DIN, DR, D1i, D2, D3 D4, etc. input from the input/output port 32 to the RAM 34, thereby to execute each control program. It should be noted that a control program contained in an EPROM built in each editor is rewritten according to the alteration of layout design standards and layout techniques, whenever it is necessary to do so.

The design data DIN, as shown in FIG. 7, constitutes a net list for an IC to be newly designed. Specifically, the net list is a one wherein there are listed the circuit elements constituting the IC, parameters specific to each circuit element and connective relations among circuit elements. As an active element, there are described p-type FETs (referred to as "transistors TP") and n-type FETs (referred to as "transistors TN"). And, as a passive element, there are described capacitors formed of p-type FETs (hereinafter, simply referred to as "capacitors CP"), capacitors formed of n-type FETs (hereinafter, referred to as "capacitors CN") and resistors R. There are also special circuits such as inverter-CR delay circuits (hereinafter, referred to as "inverters ICRP or ICRN").

As shown in FIG. 8, the rule data DR is data with which the layout design standards based on wafer process are prescribed. For example, the data DR includes data of the following kinds which are labeled as "%Resistor classification names", "%P-channel transistor classification names", "%N-channel transistor classification names", "%P-channel transistor maximum gate width", "%N-channel transistor maximum gate width", "%P-channel diffusion layer separation", "%N-channel diffusion layer separation", "Minimum contact window width" and "Minimum contact window longitudinal width".

Now, we discuss the operation of the system for designing an IC according to a preferred embodiment of the invention, referring to FIG. 9, 10, 12 and 14 which show the flow charts of the system program. If a memory array is to be designed, for example, by constituting each unit cell with transistors TP and TN, capacitors CP and CN, resistors R and inverters ICRP or ICRN, and by arranging the unit cells, then as shown in the main routine of FIG. 9, the program first reads in the net list for an IC to be designed at step P151.

At step P152, from the net list, the program separates transistors TP and TN, capacitors CP and CN, resistors R and inverters ICRP or ICRN which are the smallest device units to be arranged in an identical area.

Figure 11:
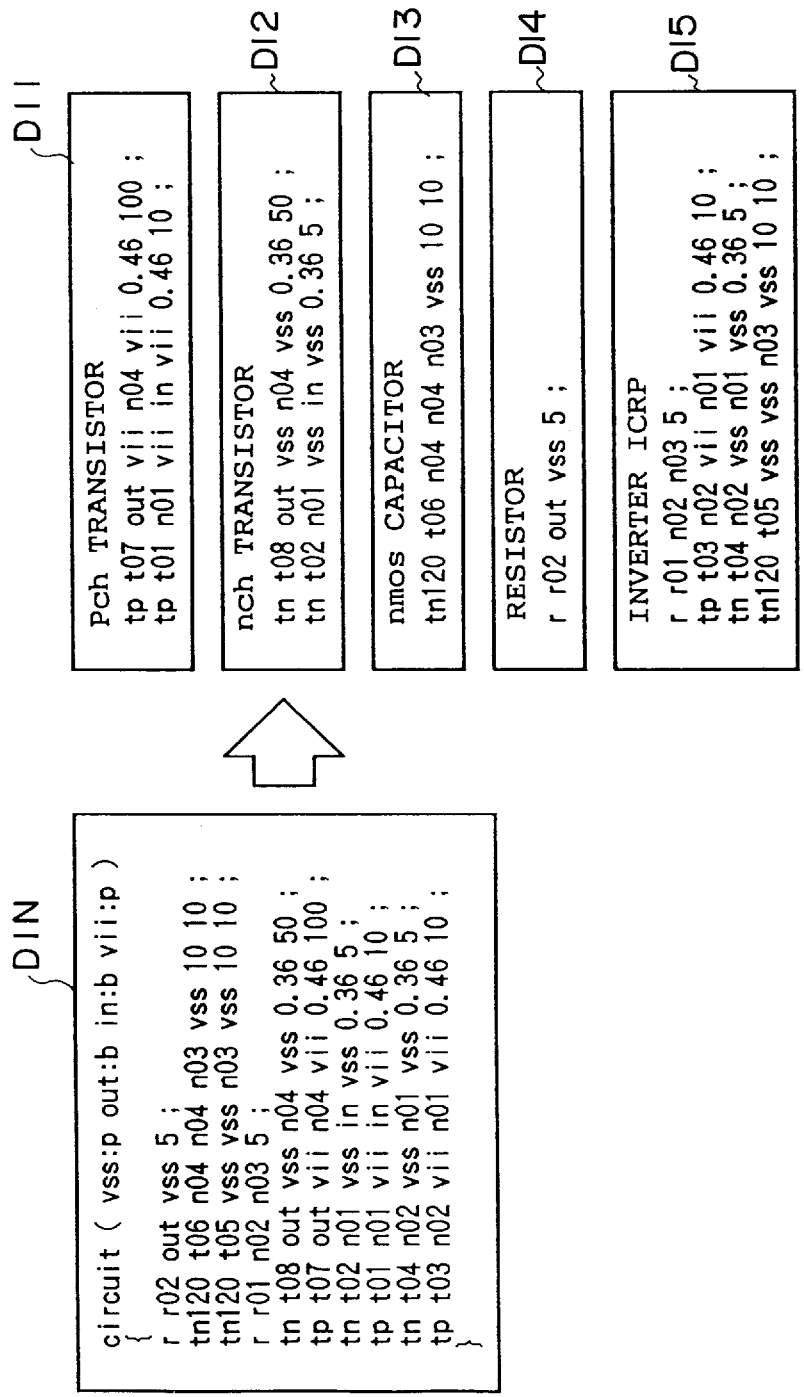
FIG. 11 is a diagram illustrating an exemplary list classification concerning the flow chart of the list classification shown in FIG. 10.

Proceeding to the subroutine of FIG. 10, the program causes design data DIN to be transferred to itself, at step P21. At step P22, the program determines if there is a transistor TP in the net list. If it is found (YES), the program proceeds to step P23 to extract it. Specifically, as shown in FIG. 11, the element data D11 of a transistor TP is separated from the design data DIN. If the transistor TP is not found (NO), the process proceeds to step P24.

Subsequently, at step P24, the program determines if there is a transistor TN in the net list. If it is found (YES), it is extracted at step P25. Specifically, as shown in FIG. 11, the element data D12 of a transistor TN is separated from the design data DIN. Otherwise, if the transistor TN is not found (NO), the process proceeds to step P26. At step P26, the voltages applied to the back gates (or substrates) of the transistors TP and TN are classified.

Then, at step P27, the program determines if there is a capacitor CP in the net list. If it is found (YES), the program proceeds to step P28 to extract it. Otherwise (NO), it proceeds to step P29. Similarly, at step P29, the program determines if there is a capacitor CN in the net list. If it is found (YES), the program proceeds to step P210 to extract it. Otherwise (NO), it proceeds to step P211. Specifically, as shown in FIG. 11, the element data D13 for a capacitor CN is separated from the design data DIN.

At step P211, the program determines if there is a resistor R in the net list. If it is found (YES), the program proceeds to step P212 to extract it. Otherwise (NO), it proceeds to step P213. Specifically, as shown in FIG. 11, the element data D14 for a resistor R is separated from the design data DIN.

Also, at step P213, the program determines if there is an inverter ICRP or ICRN in the net list. If either is found (YES), the program proceeds to step P214 to extract it. Otherwise (NO), it proceeds to step P215. Specifically, as shown in FIG. 11, the element data D15 for an inverter ICRP or ICRN is separated from the design data DIN.

Thus, from the net list, there can be separated transistors TP and TN, capacitors CP and CN, resistors R and inverters ICRP or ICRN which are the smallest device units. The program determines if it is to return at step P215. If so (YES), it returns to the main routine. Otherwise (NO), it returns to step P21.

Figure 13:
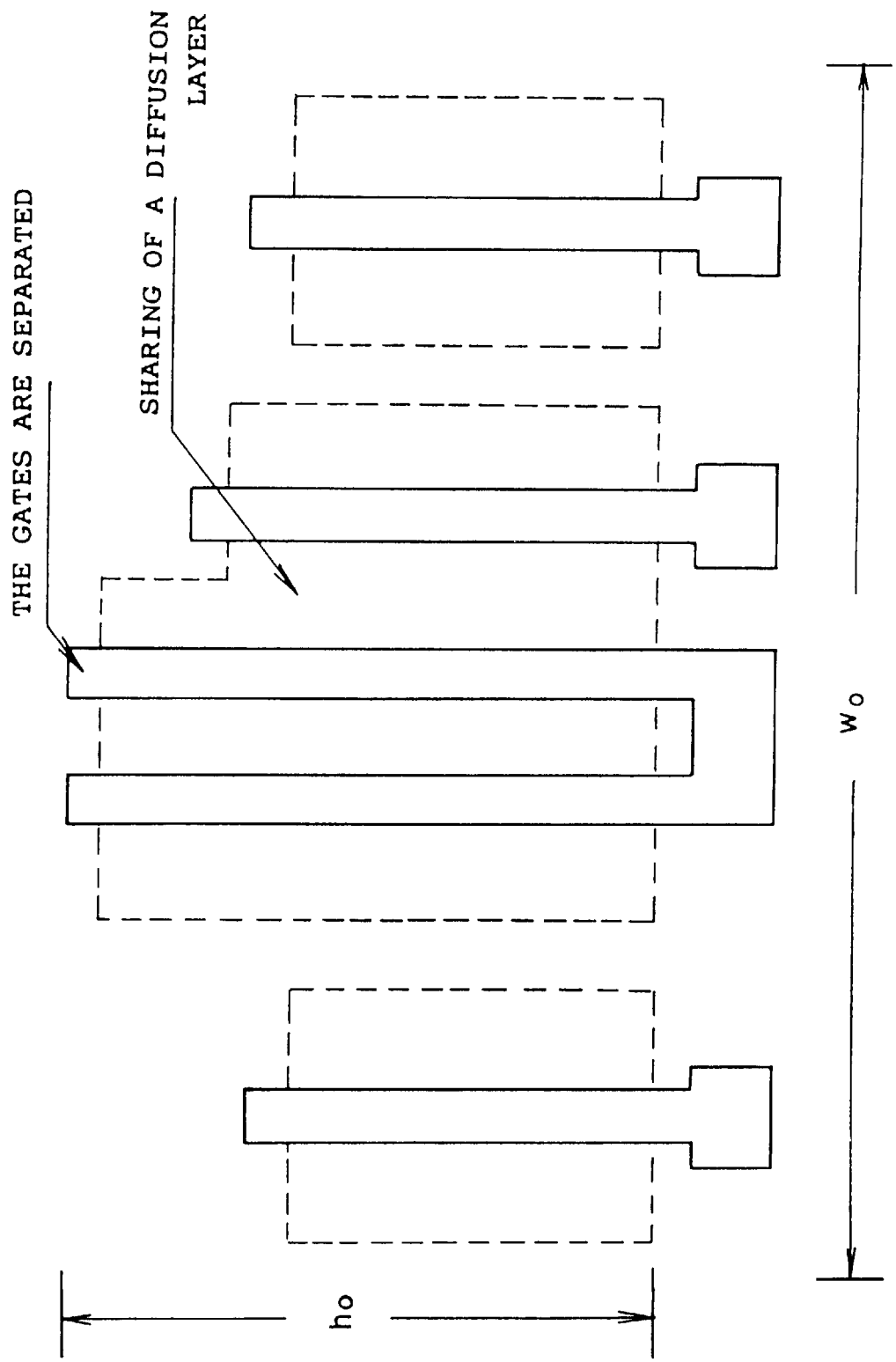
FIG. 13 is a diagram illustrating an example of image creation concerning the flow chart of IC design shown in FIG. 9.

At step P153 in the main routine, the program frames the patterns for transistors TP and TN, capacitors CP and CN, resistors R and inverters ICRP or ICRN on the basis of the layout design standards of the IC. The program first proceeds to the subroutine of FIG. 12 to read element data D11 at step P31 and to read rule data DR at step P32. In the embodiment, we discuss only the case of a transistor TP as shown in FIG. 13.

At step P33, the program frames a pattern based on the ratio W/L (channel width/channel length) of the transistor TP, where the rule data DR is referred to for the ratio W/L.

Then, at step P34, the program determines if there is any separation of gates in the cell. If so (YES), the program proceeds to step P35 to separate the gates from one another. Otherwise (NO), it proceeds to step P36. Specifically, as shown in FIG. 13, the gates are separated on the diffusion layer. In this case, the program considers the gate width dependent upon the operation speeds of the transistors.

Thereafter, at step P36, the program determines if there is any sharing of a diffusion layer. If so (YES), the program proceeds to step P37 to recognize the sharing of the layer. In this case, the program considers connective relations of the source and the drain of the next stage transistor. Among circuit elements, source(s) and drain(s) may share a diffusion layer. Otherwise (NO), it proceeds to step P38.

Also, at step P38, the program determines if there is any contact hole. If so (YES), the program proceeds to step P39 to extend the diffusion layer. Otherwise (NO), it proceeds to step P310. These steps being executed, an image of the transistor TP with a longitudinal width "ho" and a transverse width "wo" can be framed as shown in FIG. 13. Specifically, image data D2 of the transistor TP can be framed by means of the image framing editor 22 to be displayed on the display 29. In finding the area of the transistor TP, that is, s=ho×wo, the image data D2 can be transferred to the area calculating editor 23 to obtain the area data D3. At step P310 the program determines if it is to return to the main routine. If so (YES), it returns to the main routine. Otherwise (NO), it returns to steps P31 and P32.

Then, at step P154 of the main routine, the program calculates the unit area of the IC and determines if it is to predict the area of the whole circuit or not. If it is (YES), it proceeds to step P155. Otherwise (NO), it proceeds to step P157.

Here, assuming that the program makes the prediction, it proceeds to step P51 of the subroutine in FIG. 14, where it reads the image data D2 of the IC.

Figure 15:
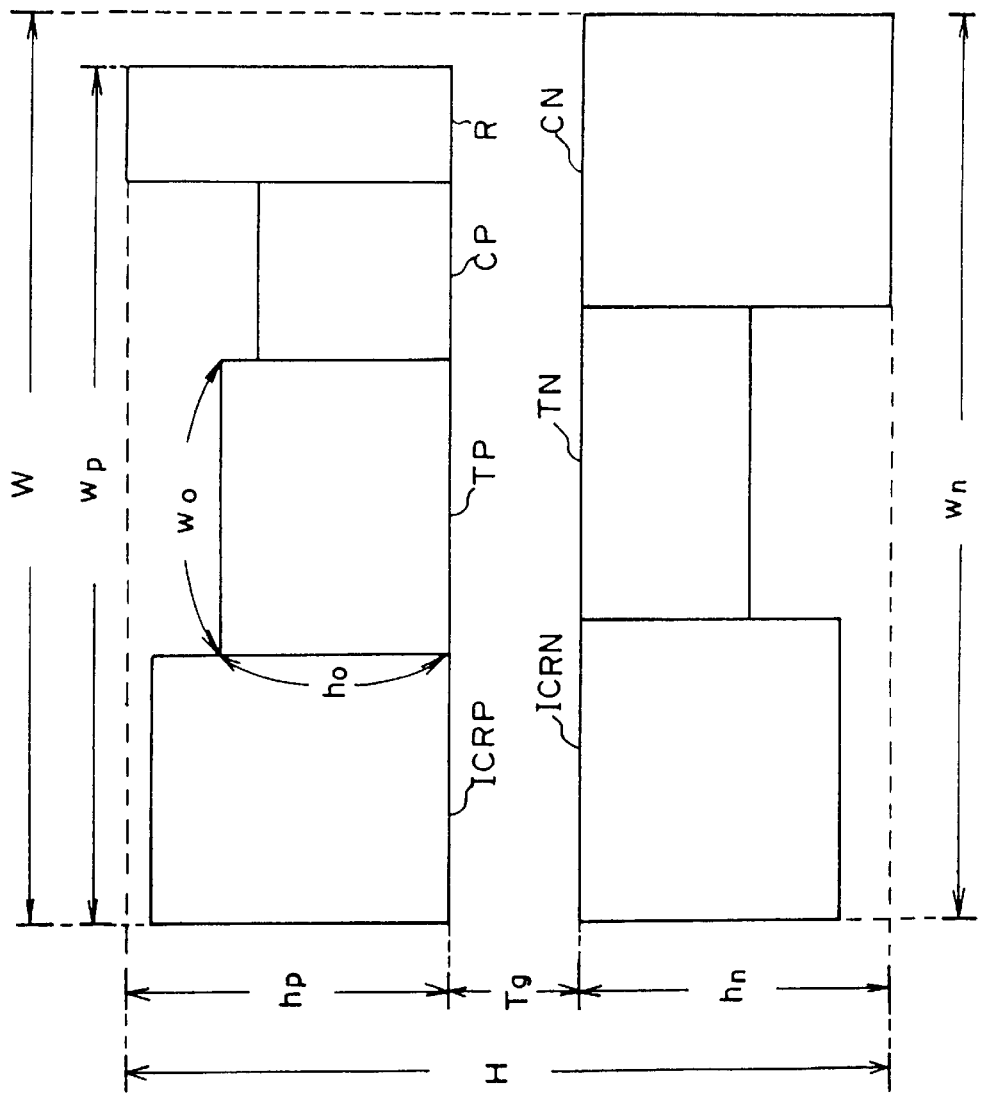
FIG. 15 is a diagram explaining an example of area calculation concerning the flow chart (of a subroutine) of area calculation shown in FIG. 14.

At step P52, the program separates transistors TP, capacitors CP, resistors R and inverters ICRP which are formed on a p-type well layer from transistors TN, capacitors CN and inverters ICRN which are formed on a n-type well layer. Assuming the number of elements of each kind mentioned above to be one, as shown in FIG. 15, each element pattern of the separated elements—a transistor TP, a capacitor CP, a resistor R and an inverter ICRP—is arranged in order of data input on a p-type well layer (an assigned area in the figure). And similarly, each element pattern of the other separated elements—a transistor TN, a capacitor CN and an inverter ICRN—is arranged in order of data input on n-type well layer.

Thus, there is provided a set of the respective element patterns corresponding to transistors TP, capacitors CP, resistors R and inverters ICRP gathered on a p-type well layer (hereinafter, referred to as a "p-well element pattern set") and a set of the respective element patterns corresponding to transistors TN, capacitors CN and inverters ICRN gathered on an n-type well layer (hereinafter, referred to as an "n-well element pattern set").

Also, at step P53, the program determines if it has completed the separation and arrangement of each cell. If the program has completed it (YES), it proceeds to step P54 to calculate the transverse width "wp" of the p-well element pattern set. In this case, the transverse width "wp" is equal to the sum of the respective transverse width of transistors TP, capacitors CP, resistors R and inverters ICRP. Otherwise (NO), it returns to step P52.

Subsequently, at step P55, the program calculates the transverse width "wn" of the n-well element pattern set. In this case, the transverse width "wn" is equal to the sum of the respective transverse width of transistors TN, capacitors CN and inverters ICRN.

Then, at step P56, the program compares the transverse width "wp" and the transverse width "wn" to select and output the larger one "wp" or "wn" as a transverse width of a unit cell of the IC.

In parallel with this, the program calculates the longitudinal width "hp" of the p-well element pattern set at step P57. In this case, the program selects the largest one of the respective longitudinal widths of transistors TP, capacitors CP, resistors R and inverters ICRP.

Also, at step P58, the program calculates the longitudinal width "hn" of transistors TN, capacitors CN and inverters ICRN on a n-type well layer. Then, at step P59, the longitudinal width H of the unit cell of the IC is calculated. In this case, as a longitudinal width "hn", the largest one of the respective longitudinal width of transistors TN, capacitors CN and inverters ICRN is selected. A transistor interval Tg is read from the rule data DR. From these, a longitudinal width $$H = hp + Tg + hn$$

is calculated.

Then, at step P510, the program calculates the whole area of the unit cell of the IC, S=W×H. Specifically, The area data D31 of the unit cell of the IC is output from the area calculating editor 23. Note that the area of a layout element on a p-type well layer is calculated with the expression "wp×hp" and the area of a layout element on a n-type well layer is calculated with the expression "wn×hn". Also, at step P511, the program determines if it is to return to the main routine. If so (YES), it returns to the main routine. Otherwise (NO), it returns to step P51.

At step P156 of the main routine, the program frames second layout data DOUT2 on the basis of area data D31 and symbol data D4. Specifically, the circuit pattern framing editor 24 converts in format the area data D31 of the unit cells of the IC into the symbol data D41 each representative of the circuit symbol of each element pattern. Further, the symbol data D41 are converted in format by the layout editor 25 into layout data DOUT2.

If the program had determined not to predict the area of the IC at step P154, it proceeds to step P7 to frame layout data DOUT1 from image data D2. In this case, the image data D2, of a smallest units corresponding to transistors TP and TN, capacitors CP and CN and resistors R, are converted in format by the layout editor 25 into layout data DOUT1.

At step P8, the program arranges the unit cells of the IC on the basis of layout data DOUT1 or DOUT2. At this time, the unit cells of the memory array are spread all over the central area of the chip and I/O circuit, etc., are arranged on the periphery of the area.

Moreover, the layout editor 25 wires between the memory array and the I/O circuit and the CPU 31 executes a circuit simulation to examine signal delays and clock skews.

Then, at step P159 the program determines if it has completed the layout. If so (YES), it terminates its control and otherwise (NO), it goes back to step P151. Thus, the program can design memory, etc., in which a memory array including transistors TP and TN, capacitors CP and CN, resistors R and inverters ICRP or ICRN is used.

As described above, a system for designing an IC according to a preferred embodiment of the invention, as shown in FIG. 5, comprises an extracting list editor 21, an image framing editor 22, an area calculating editor 23, a circuit pattern framing editor 24, a layout editor 25, a main memory 26, a sub-memory 27, a layout memory 28, a display 29, a keyboard 30 and a CPU 31.

Therefore, the unit cells can be arranged in a layout area of the IC under design which is predicted from area data D3. Concretely, the cells of the IC are arranged on the basis of either layout data DOUT1 framed by layout editor 25 from image data D2 or layout data DOUT2 framed from area data D3 and symbol data D4. Then, by wiring the arranged cells, a simulation by the CPU 31 is executed on a circuit most similar to the pattern of a finished chip.

Thus, the inventive system automates the floor planning which have been done by manual operations in the related art. A layout image may be framed discriminating a layout of special circuits such as an inverter-CR delay circuit from a layout of the other circuits.

Figure 9:
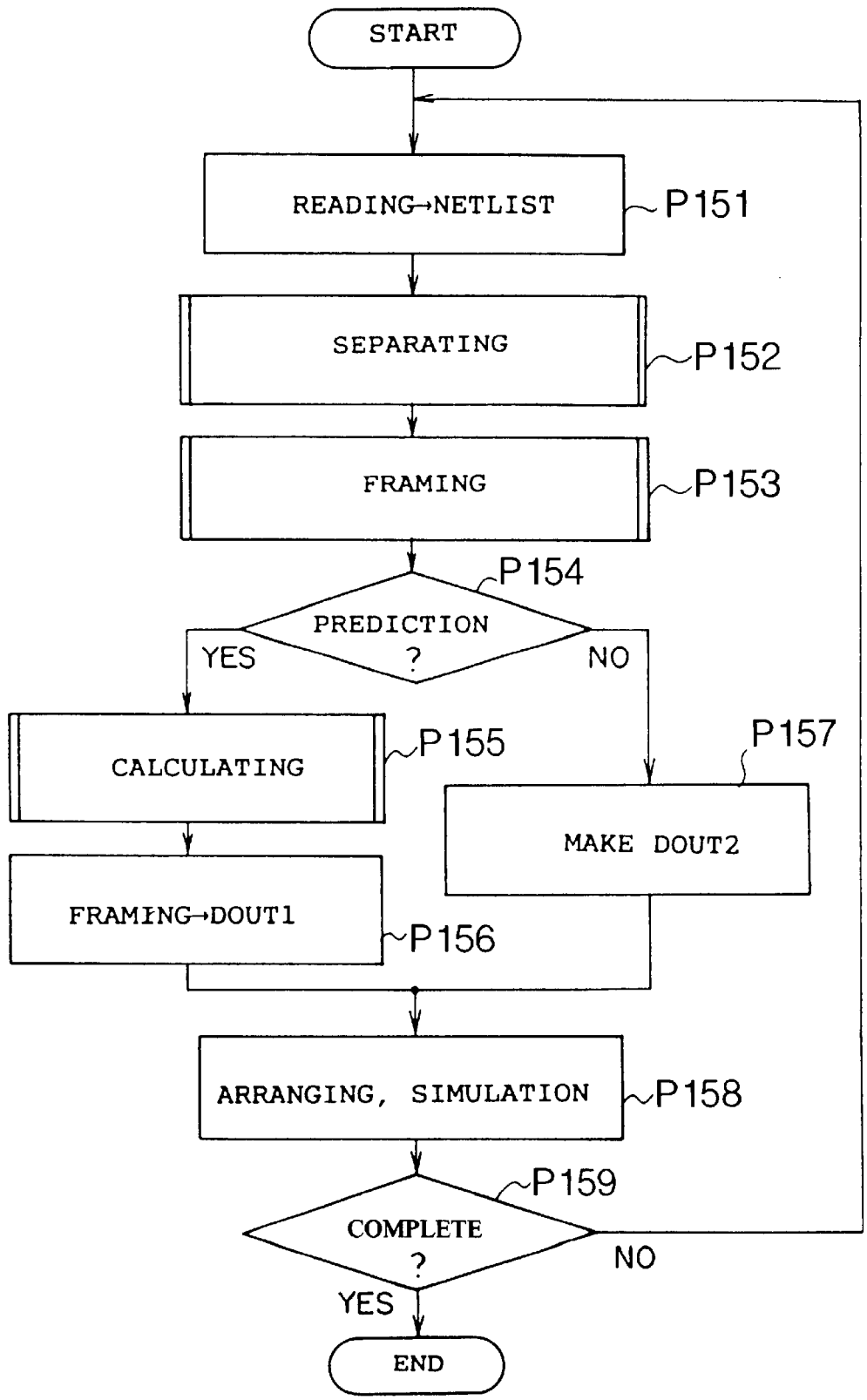
FIG. 9 is a flow chart (of a main routine) of IC design according to a preferred embodiment of the invention.

According to a method for designing an IC in accordance with a preferred embodiment of the invention, as shown in FIG. 9, at step P152, from the net list of an IC to be designed, there are separated transistors TP and TN, capacitors CP and CN, resistors R and inverters ICRP or ICRN which are the smallest device units to be arranged in an identical area. Subsequently, at step P153, each image of the transistors TP and TN, capacitors CP and CN, resistors R and inverters ICRP or ICRN is formed on the basis of the layout design standards.

The inventive method permits the unit cells to be automatically determined considering the integration of the unit cells, on the basis of element data D11, D12 and so on of the extracted transistors TP and TN, capacitors CP and CN which are the smallest device units, and resistors R, in an earlier stage of design as compared with the related art of the invention.

At step P510 of FIG. 4, the area of a unit cell in the IC, that is, W×H, is calculated from a collective pattern representative of a unit pattern. The whole area of the IC can be predicted from the calculated area.

Thus, the size of the whole chip can be predicted in an early stage, which includes a memory array comprising unit cells and many repetitive patterns and surrounded by peripheral circuits.

In designing an IC such as a memory device, etc., the whole area of the IC can be precisely and promptly estimated on the basis of a net list without depending on the cell library method.

Further, at step P158 of FIG. 9, the unit cells are arranged within a layout range predicted from the whole area of the IC.

The optimization of unit cell arrangement and wiring among unit cells enables a simulation of the whole circuit on a chip with almost the same pattern as that of a finished product and accordingly a precise examination of the operation of the IC.

Thus, a floor planning which has been performed manually as in the related art is automated, causing the time period for layout to be reduced, which can sufficiently cope with the design of an IC such as a memory, etc.

Further, according to a method for designing an IC of the invention, the control program can be rewritten according demands in design and wafer processing.

Therefore, the method can cope promptly with alterations of the layout design standards of an IC device and the layout techniques. It greatly contributes to the early development of a new IC device and the functional enhancement of an IC design system.

What is claimed is:

1. A tool, in an integrated circuit design system for designing an integrated circuit, for determining an area of a unit cell which forms a circuit having a designated function, said tool comprising:

a first storage for storing a net list of a unit cell lo be designed, said net list having element data which describe elements for forming the unit cell, element parameters of each element, and connections among the elements;

a second storage for storing rule data of layout design standards for forming the unit cell according to a wafer process;

reading and classifying means for reading out said net list from said first storage and classifying said element data in said net list based upon different kinds of element groups indicative of corresponding types of elements;

layout image forming means for forming layout images of each of said element groups for applying said rule data to said element data; and calculating means for calculating approximate areas of each element group according to the layout images obtained of each element group and for summing up the approximate areas of each element group so as to estimate the unit cell area, without using a cell library.

2. The tool according to claim 1, wherein said reading and classifying means classifies said element data based upon different kinds of element groups including transistors, capacitors, resistors and CR delay circuits.

3. The tool according to claim 2, wherein said reading and classifying means further classifies the transistor group into two groups according to conduction types.

4. The tool according to claim 3, wherein said calculating means calculates the unit cell area by placing a layout image of the transistor group having one conduction type in a first row and another layout image of the transistor group having another conduction type in a second row, and then summing up the respective areas of each row.

5. The tool according to claim 3, wherein said reading and classifying means further classifies the transistor group based upon voltages supplied to backgates thereof.

6. The tool according to claim 1, wherein said reading and classifying means classifies said element data into a first collective element pattern of elements which share a diffusion layer, and a second collective element pattern of elements, gates of which are separated from one another.

7. The tool according to claim 1, wherein said reading and classifying means classifies said element data into a first collective element pattern of elements which share a diffusion layer, and a second collective element pattern of elements, gates of which are separated from one another by processing element patterns of first and second conductivity type transistors which have been extracted from said net list.

8. A method for determining a unit cell area for use in designing a semiconductor integrated circuit, the method comprising the steps of:

providing a net list in which element names for forming a unit cell which forms a circuit having a designated function, element parameters for each element, and connections among the elements are described;

providing rule data of layout design standards for forming the unit cell according to a wafer process;

reading out said net list and classifying respective data contained in said net list into different kinds of element groups based upon the kind of element;

applying said rule data to said different kinds of element groups so as to obtain a layout image of each different kind of element group;

calculating approximate areas of said each different kind of element group according to the layout images obtained of each different kind of element group, without using a cell library; and summing up said calculated respective areas so as to obtain the unit cell area.

9. The method according to claim 8, wherein said classifying step comprises classifying said element data based upon different kinds of elements including transistors, capacitors, resistors and CR delay circuits.

10. The method according to claim 8, wherein said classifying step further comprises classifying said transistor group into two groups according to conduction types recited in said net list.

11. The method according to claim 9, wherein said classifying step further comprises classifying the transistors based upon voltages supplied to backgates thereof.

12. A tool, in an integrated circuit design system for designing an integrated circuit, for determining a unit cell area, said tool comprising:

a first storage for storing a net list of a unit cell to be designed, said net list having element data which describe elements for forming the unit cell, element parameters of each element, and connections among the elements;

a second storage for storing rule data of layout design standards for forming the unit cell according to a wafer process;

reading and classifying means for reading out said net list from said first storage and classifying said element data in said net list based upon different kinds of element groups indicative of corresponding types of elements;

layout image forming means for forming layout images of each of said element groups for applying said rule data to said element data; and calculating means for determining transverse widths of first and second conductivity type well layers and longitudinal widths of said first and second type conductivity type well layers, and estimating the unit cell area based upon the transverse widths and the longitudinal widths, without using a cell library.

13. The tool according to claim 12, wherein said calculating means determines the transverse width of the first conductivity type well layer by summing transverse widths of the elements to be formed on the first conductivity type well layer and the transverse width of the second conductivity type well layer by summing transverse widths of the elements to be formed on the second conductivity type well layer and selects the larger of the transverse widths of the first and second conductivity type well layers as the transverse width of the unit cell, said calculating means selects a largest one of respective longitudinal widths of the elements to be formed on the first conductivity type well layer as the longitudinal width of the first conductivity type well layer, selects a largest one of respective longitudinal widths of the elements to be formed on the second conductivity type well layer as the longitudinal width of the second conductivity type well layer, and sums of the longitudinal widths of the first and second conductivity type well layers with a transistor interval read from the rule data to determine the longitudinal width of the unit cell, said calculating means multiplying the transverse width and the longitudinal width of the unit cell to estimate the unit cell area.

14. A method for determining a unit cell area for use in designing a semiconductor integrated circuit, said method comprising the steps of:

storing a net list of a unit cell to be designed, said net list having element data which describe elements for forming the unit cell, element parameters of each element, and connections among the elements;

storing rule data of layout design standards for forming the unit cell according to a wafer process;

reading out said net list and classifying said element data in said net list based upon different kinds of element groups indicative of corresponding types of elements;

forming layout images of each of said element groups for applying said rule data to said element data; and determining transverse widths of first and second conductivity type well layers and longitudinal widths of said first and second type conductivity type well layers, and estimating the unit cell area based upon the transverse widths and the longitudinal widths, without using a cell library.

15. The tool according to claim 14, wherein said step of determining transverse widths and longitudinal widths comprises the steps of:

summing transverse widths of the elements to be formed on the first conductivity type well layer to determine the transverse width of the first conductivity type well layer;

summing transverse widths of the elements to be formed on the second conductivity type well layer to determine the transverse width of the second conductivity type well layer;

selecting the larger of the transverse widths of the first and second conductivity type well layers as the transverse width of the unit cell;

selecting a largest one of respective longitudinal widths of the elements to be formed on the first conductivity type well layer as the longitudinal width of the first conductivity type well layer;

selecting a largest one of respective longitudinal widths of the elements to be formed on the second conductivity type well layer as the longitudinal width of the second conductivity type well layer;

reading a transistor interval from the rule data;

summing the longitudinal widths of the first and second conductivity type well layers with the transistor interval data to determine the longitudinal width of the unit cell; and multiplying the transverse width and the longitudinal width of the unit cell to estimate the unit cell area.

16. A method for use in designing a semiconductor integrated circuit, said method comprising the steps of:

storing a net list of a unit cell to be designed, said net list having element data which describe elements for forming the unit cell, element parameters of each element, and connections among the elements;

storing rule data of layout design standards for forming the unit cell according to a wafer process;

reading out said net list and classifying said element data in said net list based upon different kinds of element groups indicative of corresponding types of elements;

framing a pattern based upon a ratio W/L (channel width/channel length) of a transistor, wherein a value of the ratio W/L is provided in the rule data, the framing of a pattern including the steps of determining whether there is separation of gates in the unit cell, and if there is separation, separating the gates on a diffusion layer, determining whether there is any sharing of the diffusion layer by electrodes of the transistor, determining a transverse width and a longitudinal width of the transistor based upon the ratio W/L, the separation of the gates and whether there is sharing of the diffusion layer, without using a cell library, and framing the transistor based upon the transverse width and the longitudinal width.

17. The method according to claim 16, wherein said step of framing a pattern further comprises the step of determining if the transistor has a contact hole and extending the diffusion layer is the transistor has the contact hole.

18. The method according to claim 16, further comprising the step of determining an area of the transistor based upon the transverse width and longitudinal width of the transistor.

19. A tool, in an integrated circuit design system for designing an integrated circuit, for determining an area of a unit cell which forms a circuit having a designated function, said tool comprising:

a first storage for storing a net list of a unit cell to be designed, said net list having element data which describe elements for forming the unit cell, element parameters of each element, and connections among the elements;

a second storage for storing rule data of layout design standards for forming the unit cell according to a wafer process;

reading and classifying means for reading out said net list from said first storage and classifying said element data in said net list based upon different kinds of element groups indicative of corresponding types of elements;

layout image forming means for forming layout images of each of said element groups for applying said rule data to said element data; and calculating means for calculating approximate areas of each element group according to the layout images obtained of each element group and for summing up the approximate areas of each element group so as to estimate the unit cell area, without using a cell library;

wherein said calculating means determines whether any sharing of diffusion regions and necessity of gate dividing exists between each of said element groups, and uses the determinations to estimate the unit cell area.

20. The tool according to claim 19, wherein said calculating means determines connective relations of each element group to estimate the unit cell area.

21. A method for determining a unit cell area for use in designing a semiconductor integrated circuit, the method comprising the steps of:

providing a net list in which element names for forming a unit cell which forms a circuit having a designated function, element parameters for each element, and connections among the elements are described;

providing rule data of layout design standards for forming the unit cell according to a wafer process;

reading out said net list and classifying respective data contained in said net list into different kinds of element groups based upon the kind of element;

applying said rule data to said different kinds of element groups so as to obtain a layout image of each different kind of element group;

determining whether there is sharing of diffusion layers between each different kind of element group;

calculating approximate areas of said each different kind of element group according to the layout images obtained of each different kind of element group, and the determination of sharing of diffusion layers, without using a cell library; and summing up said calculated respective areas so as to obtain the unit cell area.

22. A tool, in an integrated circuit design system for designing an integrated circuit, for determining a unit cell area, said tool comprising:

a first storage for storing a net list of a unit cell to be designed, said net list baving element data which describe elements for forming the unit cell, element parameters of each element, and connections among the elements;

a second storage for storing rule data of layout design standards for forming the unit cell according to a wafer process;

reading and classifying means for reading out said net list from said first storage and classifying said element data in said net list based upon different kinds of element groups indicative of corresponding types of elements;

layout image forming means for forming layout images of each of said element groups for applying said rule data to said element data, determining whether a contact hole exists and extending a diffusion region if the contact hole exists; and calculating means for determining transverse widths of first and second conductivity type well layers and longitudinal widths of said first and second type conductivity type well layers using dimensions of the diffusion region, and estimating the unit cell area based upon the transverse widths and the longitudinal widths, without using a cell library.

23. A method for determining a unit cell area for use in designing a semiconductor integrated circuit, said method comprising the steps of:

storing a net list of a unit cell to be designed, said net list having element data which describe elements for forming the unit cell, element parameters of each element, and connections among the elements;

storing rule data of layout design standards for forming the unit cell according to a wafer process;

reading out said net list and classifying said element data in said net list based upon different kinds of element groups indicative of corresponding types of elements;

determining whether a contact hole exists and extending a diffusion region if the contact hole exists;

forming layout images of each of said element groups for applying said rule data to said element data using dimensions of the diffusion region; and determining transverse widths of first and second conductivity type well layers and longitudinal widths of said first and second type conductivity type well layers, and estimating the unit cell area based upon the transverse widths and the longitudinal widths, without using a cell library.

* * * * *